US010902892B2

United States Patent
Tsukada

(10) Patent No.: US 10,902,892 B2
(45) Date of Patent: Jan. 26, 2021

(54) INPUT BUFFER CIRCUIT HAVING DIFFERENTIAL AMPLIFIER

(71) Applicant: MICRON TECHNOLOGY, INC., Boise, ID (US)

(72) Inventor: Shuichi Tsukada, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 16/357,085

(22) Filed: Mar. 18, 2019

(65) Prior Publication Data

US 2020/0302977 A1  Sep. 24, 2020

(51) Int. Cl.
*H03F 3/45* (2006.01)
*G11C 7/10* (2006.01)
*H03F 3/68* (2006.01)

(52) U.S. Cl.
CPC ....... *G11C 7/1084* (2013.01); *H03F 3/45269* (2013.01); *H03F 3/68* (2013.01); *H03F 2200/375* (2013.01); *H03F 2200/453* (2013.01); *H03F 2200/456* (2013.01); *H03F 2203/45354* (2013.01)

(58) Field of Classification Search
CPC ............... H03F 3/45; H03F 2200/375; H03F 2200/453; H03F 2200/356; H03F 2200/456; H03K 19/0813; H03K 19/018514; G11C 7/1084

USPC ........................................... 327/333; 330/253
See application file for complete search history.

(56) References Cited

U.S. PATENT DOCUMENTS

| 8,183,932 B2* | 5/2012 | Zolfaghari | G01S 19/36 330/117 |
| 2009/0115519 A1* | 5/2009 | Ishiguro | H03F 3/303 330/255 |
| 2016/0182051 A1* | 6/2016 | Yang | H03K 19/018514 327/333 |

* cited by examiner

*Primary Examiner* — Steven J Mottola
(74) *Attorney, Agent, or Firm* — Dorsey & Whitney LLP

(57) ABSTRACT

Disclosed herein is an apparatus that includes first and second signal lines; a first differential amplifier having an inverting input node receiving an input signal, a non-inverting input node receiving a reference potential, and an output node connected to the first signal line; a second differential amplifier having an inverting input node receiving the reference potential, a non-inverting input node receiving the input signal, and an output node connected to the second signal line; a level shift circuit cross-coupled to the first and second signal lines; a first replica circuit connected to the first signal line; a second replica circuit connected to the second signal line; and a first switch circuit configured to activate one of the level shift circuit, the first replica circuit, and the second replica circuit.

20 Claims, 5 Drawing Sheets

L # INPUT BUFFER CIRCUIT HAVING DIFFERENTIAL AMPLIFIER

BACKGROUND

In recent years, the amplitude of signals input to a semiconductor device is very small. Therefore, them are cases where a high-sensitivity differential amplifier is used in the first stage of an input buffer circuit in order to correctly determine the logic level of the input signal. However, the differential amplifier may have an input offset due to variations in five threshold of a transistor which are generated at random. The input offset of the differential amplifier is finely adjusted in a manufacturing stage of a semiconductor device by using adjustment codes.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the an to practice the present invention. Other embodiments may be utilized, and structural, logical and electrical changes may be made without departing from the scope of the present invention. The various embodiments disclosed herein are not necessarily mutually exclusive, as some disclosed embodiments can be combined with one or more oilier disclosed embodiments to form new embodiments.

Figure 1:
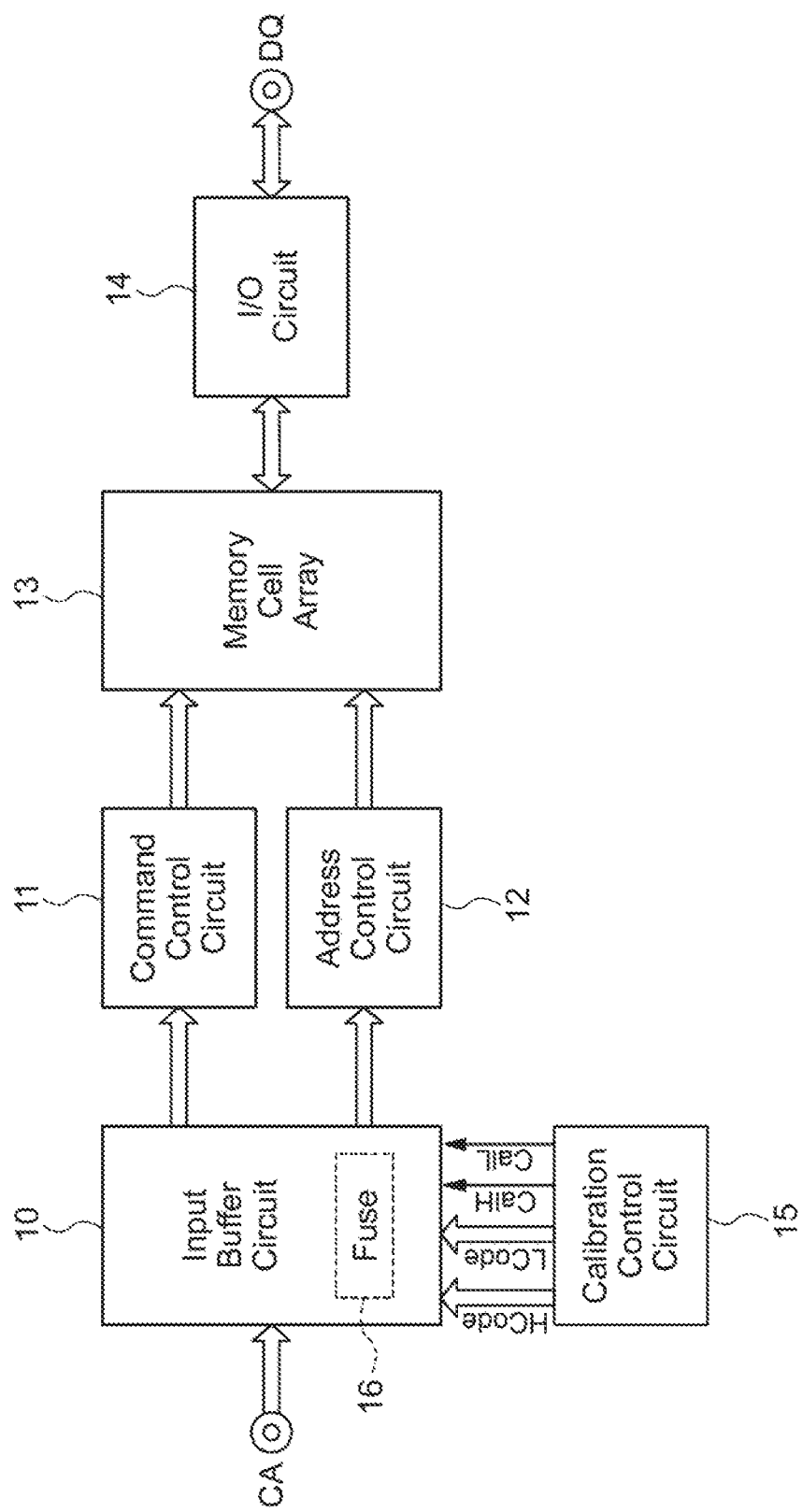
FIG. 1 is a block diagram showing a configuration of a semiconductor device according to the present disclosure.

As shown in FIG. 1, a semiconductor device according to the present embodiment includes an input buffer circuit 10 to which a command address signal CA is supplied from outside. The input buffer circuit 10 determines the logic level of the command address signal CA with a small amplitude and converts the command address signal CA to an internal signal with a larger amplitude. In the command address signal CA, an external command signal is supplied to a command control circuit 11 via the input buffer circuit 10, and an external address signal is supplied to an address control circuit 12 via the input buffer circuit 10. The command control circuit 11 includes elements such as a command decoder, and supplies an internal command signal generated on the basis of the external command signal to a memory cell array 13. The address control circuit 12 includes elements such as an address decoder, and supplies an internal address signal generated on the basis of the external address signal to the memory cell array 13. The memory cell array 13 performs a read operation or a write operation on the basis of the internal command signal and the internal address signal. In the read operation, data DQ read out from the memory cell array 13 is output to outside via an I/O circuit 14. In the write operation, data DQ input from outside via the I/O circuit 14 is written into the memory cell array 13.

The semiconductor device according to the present embodiment further includes a calibration control circuit 15. The calibration control circuit 15 supplies calibration signals CalH and CalL that are activated during a calibration operation and code signals HCode and LCode few canceling an input offset to live input buffer circuit 10. The code signals HCode and LCode are stored in a fuse circuit 16 that is included in the input buffer circuit 10 in a nonvolatile manner.

Figure 2:
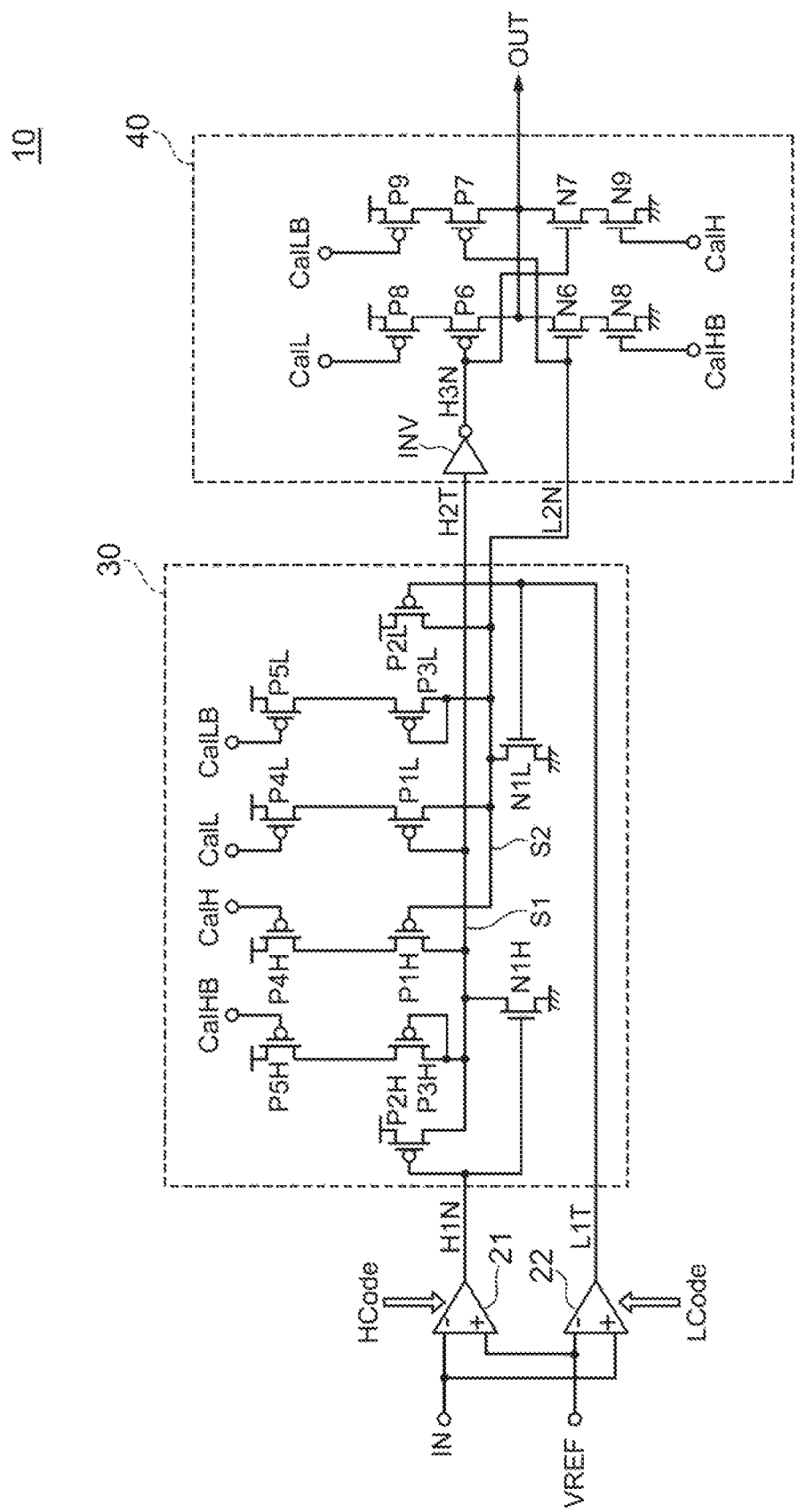
FIG. 2 is a circuit diagram of an input buffer circuit.

FIG. 2 shows a portion of circuits that constitute the input buffer circuit 10, which corresponds to one bit of the command address signal CA. As shown in FIG. 2, the input buffer circuit 10 includes differential amplifiers 21 and 22, a level shift circuit 30, and an output circuit 40. The differential amplifier 21 includes an inverting input node (−) to which an input signal IN is supplied and a non-inverting input node (+) to which a reference potential VREF is supplied, and controls the level of an internal signal H1N on the basis of a potential difference between these nodes. The differential amplifier 22 includes an inverting input node (−) to which the reference potential VREF is supplied and a non-inverting input node (+) to which the input signal IN is supplied, and controls the level of an internal signal L1T on the basis of a potential difference between these nodes. Because the input signal IN is input to the differential amplifiers 21 and 22 in opposite phases in this manner, the internal signals H1N and L1T are at a complementary level. The input offset of the differential amplifier 21 can be adjusted with the code signal HCode, and the input offset of the differential amplifier 22 can be adjusted with the code signal LCode.

Figure 3:
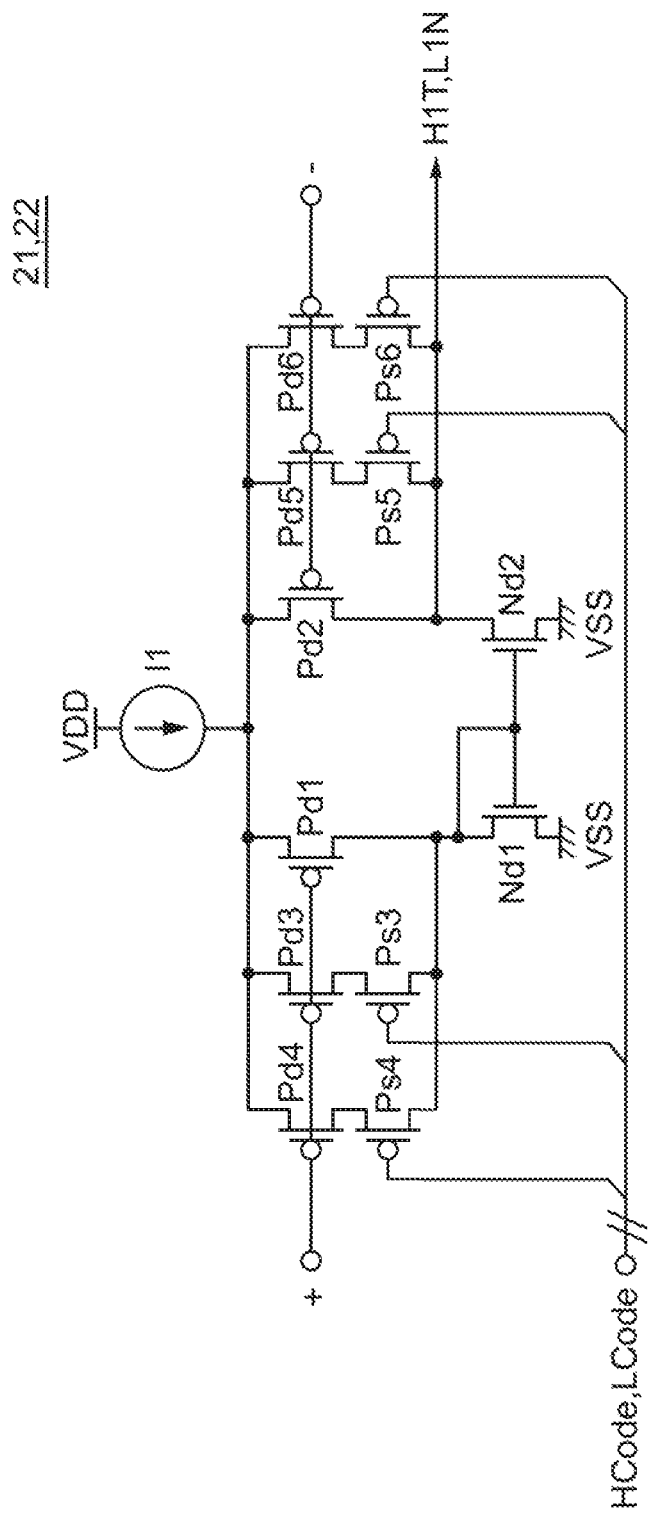
FIG. 3 is a circuit diagram of a differential amplifier.

As shown in FIG. 3, each of the differential amplifiers 21 and 22 includes a constant current source I1. P-channel MOS transistors Pd1 to Pd6 and Ps3 to Ps6, and N-channel MOS transistors Nd1 and Nd2. Gate electrodes of the transistors Pd1, Pd3, and Pd4 constitute a non-inverting input node (+), and gate electrodes of transistors Pd2, Pd5, and Pd6 constitute an inverting input node (−). The transistors Pd1, Pd3, and Pd4 are connected in parallel to one another between the constant current source I1 and the transistor Nd1. The transistors Pd2, Pd5, and Pd6 are connected in parallel to one another between the constant current source I1 and the transistor Nd2. The transistors Ps3 to Ps6 are connected in series to the corresponding transistors Pd3 to Pd6, respectively. Corresponding bits of the code signal HCode or LCode are respectively input to the gate electrodes of the transistors Ps3 to Ps6. A drain of the transistor Nd1 is connected to gate electrodes of the transistors Nd1 and Nd2 in common, and the internal signal H1N or L1N is output from a drain of the transistor Nd2.

Ideally, the threshold of the transistor Pd1 and the threshold of the transistor Pd2 match each other. However, in reality, the threshold of a transistor varies at random, and therefore there may be a small difference between the threshold of the transistor Pd1 and the threshold of the transistor Pd2. This input offset is reduced or canceled by using the code signal HCode or LCode. For example, when the threshold of the transistor Pd2 is higher than the threshold of the transistor Pd1, a current flowing through the transistor Pd2 is less than a current flowing through the transistor Pd1 even in a case where the potential at the non-inverting input node (+) and the potential at the inverting input node (−) match each other. In this case, balance with respect to the current flowing through the transistor Pd1 is adjusted by turning on the transistor Ps5 and/or the transistor Ps6 by using the code signal HCode or LCode.

Referring back to FIG. 2, the internal signals H1N and L1T are supplied to the level shift circuit 30. The level shift circuit 30 includes an inverter circuit constituted by a P-channel MOS transistor P2H and an N-channel MOS transistor N1H and an inverter circuit constituted by a P-channel MOS transistor P2L and an N-channel MOS transistor N1L. The internal signal H1N is input to gate electrodes of the transistors P2H and N1H, and the internal signal L1T is input to gate electrodes of the transistors P2L and N1L. Therefore, signals that are complementary to each other appear on an internal signal line S1 and an internal signal line S2.

P-channel MOS transistors P1H and P1L are cross-coupled to the internal signal lines S1 and S2. That is, a drain and a gate electrode of the transistor P1H are connected to the internal signal lines S1 and S2, respectively, and a drain and a gate electrode of the transistor P1L are connected to the internal signal lines S2 and S1, respectively. A P-channel MOS transistor P4H is connected between the transistor P1H and a power line, and a P-channel MOS transistor P4L is connected between the transistor P1L and the power line. The calibration signal CalH is supplied to a gate electrode of the transistor P4H. The calibration signal CalL, is supplied to a gate electrode of the transistor P4L. The calibration signals CalH and CalL are at a low level in a normal operation, and one of these signals is at a high level in calibration. Therefore, the transistors P4H and P4L are on in the normal operation, so that a cross-coupled circuit constituted by the transistors P1H and P1L is in an active state. When the cross-coupled circuit is active, a potential difference between the internal signal lines S1 and S2 is amplified, and a potential on one of these signal lines rises to a power-source potential level. For example, in a case where the potential on the internal signal line S2 is lower than the potential on the internal signal line S1, the on-current of the transistor P1H becomes greater than the on-current of the transistor P2H, and therefore the potential on the internal signal line S1 rises to the power-source potential level. Due to this configuration, the amplitudes of the internal signals H1N and L1T output from the differential amplifiers 21 and 22 are subjected to level conversion, and resultant signals are output as internal signals H2T and L2N with a larger amplitude.

The level shift circuit 30 further includes P-channel MOS transistors P3H and P3L. A drain and a gate electrode of the transistor P3H are connected to the internal signal line S1 and a source thereof is connected to a power line via a P-channel MOS transistor P5H. A drain and a gate electrode of the transistor P3L are connected to the internal signal line S2 and a source thereof is connected to the power line via a P-channel MOS transistor P5L. The transistor P3H is a replica transistor of the transistor P1H, and the transistor P3L is a replica transistor of the transistor P1L. A calibration signal CalHB is supplied to a gate electrode of the transistor P5H, and a calibration signal CalLB is supplied to a gate electrode of the transistor P5L. The calibration signals CalHB and CalLB are inverted signals of the calibration signals CalH and CalL, respectively. Therefore, in a normal operation, the transistors P5H and P5L are kept in an off state and do not cause any influence on the internal signal lines S1 and S2.

The internal signals H2T and L2N appearing on the internal signal lines S1 and S2 are supplied to the output circuit 40. The output circuit 40 includes an inverter circuit INV that receives the internal signal H2T and generates an internal signal H3N and inverter circuits constituted by P-channel MOS transistors P6 and P7 and N-channel MOS transistors N6 and N7. P-channel MOS transistors P8 and P9 are connected between a source of the transistor P6 and a power line and between a source of the transistor P7 and the power line, respectively. N-channel MOS transistors N8 and N9 are connected between a source of the transistor N6 and a ground line and between a source of the transistor N7 and the ground line, respectively. The internal signal H3N is supplied to gate electrodes of the transistors P6 and N7 in common. The internal signal L2N is supplied to gate electrodes of the transistors N6 and P7 in common. The calibration signals CalL and CalLB are supplied to gate electrodes of the transistors P8 and P9, respectively. The calibration signals CalHB and CalH are supplied to gale electrodes of the transistors N8 and N9, respectively. Therefore, in a normal operation, an inverter circuit constituted by the transistors P6 and N6 is in an active state, so that a single-ended output signal OUT is generated.

Next, a calibration operation of the differential amplifiers 21 and 22 is described.

The calibration operation of the differential amplifiers 21 and 22 is performed in a manufacturing stage of the semiconductor device according to the present embodiment, and the code signals HCode and LCode generated by this calibration operation are stored in a nonvolatile manner in the fuse circuit 16 that is included in the input buffer circuit 10. In a normal operation, the code signals HCode and LCode are read out from the fuse circuit 16 and are respectively supplied to the differential amplifiers 21 and 22.

First, when calibration of the differential amplifier 21 is performed, the calibration signal CalH is set to a high level and the calibration signal CalL is set to a low level. In this state, potentials at a non-inverting input node (+) and an inverting input node (−) of the differential amplifier 21 are set to be the same. If there is no input offset in the differential amplifier 21, all the internal signals H1N, H2T, and H3N are expected to be at an intermediate level. During the calibration of the differential amplifier 21, the transistor P5H is on and the transistor P4H is off, and therefore the level of the internal signal L2N appearing on the internal signal line S2 does not cause any influence on the internal signal line S1. Further, in the output circuit 40, die transistors P8 and N9 are on and the transistors P9 and N8 are off, and therefore the output signal OUT is determined by the internal signal H2T appearing on the internal signal line S1. In this state, the value of the code signal HCode is changed aid the value of the code signal HCode at the time of inversion of the output signal OUT is written into the fuse circuit 16. With this process, the calibration of the differential amplifier 21 is finished.

Similarly, when calibration of the differential amplifier 22 is performed, the calibration signal CalL is set to a high level and the calibration signal CalH is set to a low level. In this slate, potentials at a non-inverting input node (+) and an inverting input node (−) of the differential amplifier 22 are set to be the same. If there is no input offset in the differential amplifier 22, both the internal signals L1T and L2N are expected to be at an intermediate level. During the calibration of the differential amplifier 22, the transistor P5L is on and the transistor P4L is off, and therefore the level of the internal signal H2T appearing on the internal signal line S1 does not cause any influence on the internal signal line S2. Further, in the output circuit 40, the transistors P9 and N8 are on and the transistors P8 and N9 are off, and therefore the output signal OUT is determined by the internal signal L2N appearing on the internal signal line S2. In this state, the value of the code signal LCode is changed, and the value of the code signal LCode at the lime of inversion of the output signal OUT is written into the fuse circuit 16. With this process, the calibration of the differential amplifier 22 is finished.

As described above, in the semiconductor device according to the present embodiment, the level on the internal signal line S2 does not cause any influence on the internal signal line S1 when the calibration of the differential amplifier 21 is performed, and the level on the internal signal line S1 does not cause any influence on die internal signal line S2 when the calibration of the differential amplifier 22 is performed. Therefore, it is possible to perform the calibration of the differential amplifiers 21 and 22 independently of each other while preventing them from causing any influence on each other.

Figure 4:
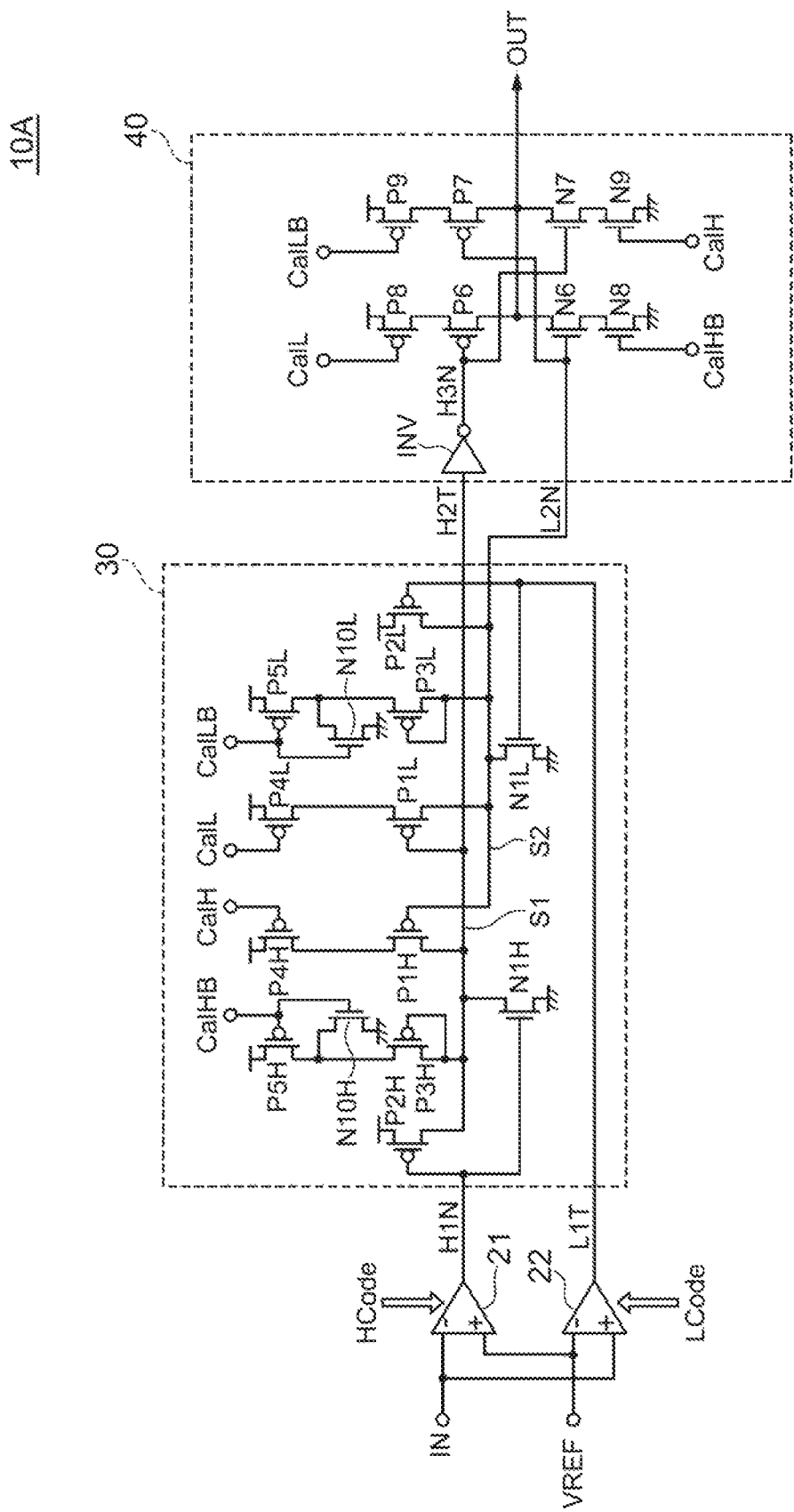
FIG. 4 is a circuit diagram of an input buffer circuit according to a first modification.

FIG. 4 is a circuit diagram of an input buffer circuit 10A according to a first modification. The input buffer circuit 10A shown in FIG. 4 is different from the input butter circuit 10 shown in FIG. 2 in that N-channel MOS transistors N10H and N10L are added in the level shift circuit 30. The calibration signals CalHB and CalLB are respectively input to gate electrodes of the transistors N10H and N10L. Therefore, the transistors N10H and N10L are on in a normal operation, so that the sources of the transistors P3H and P3L are not placed in a floating state.

Figure 5:
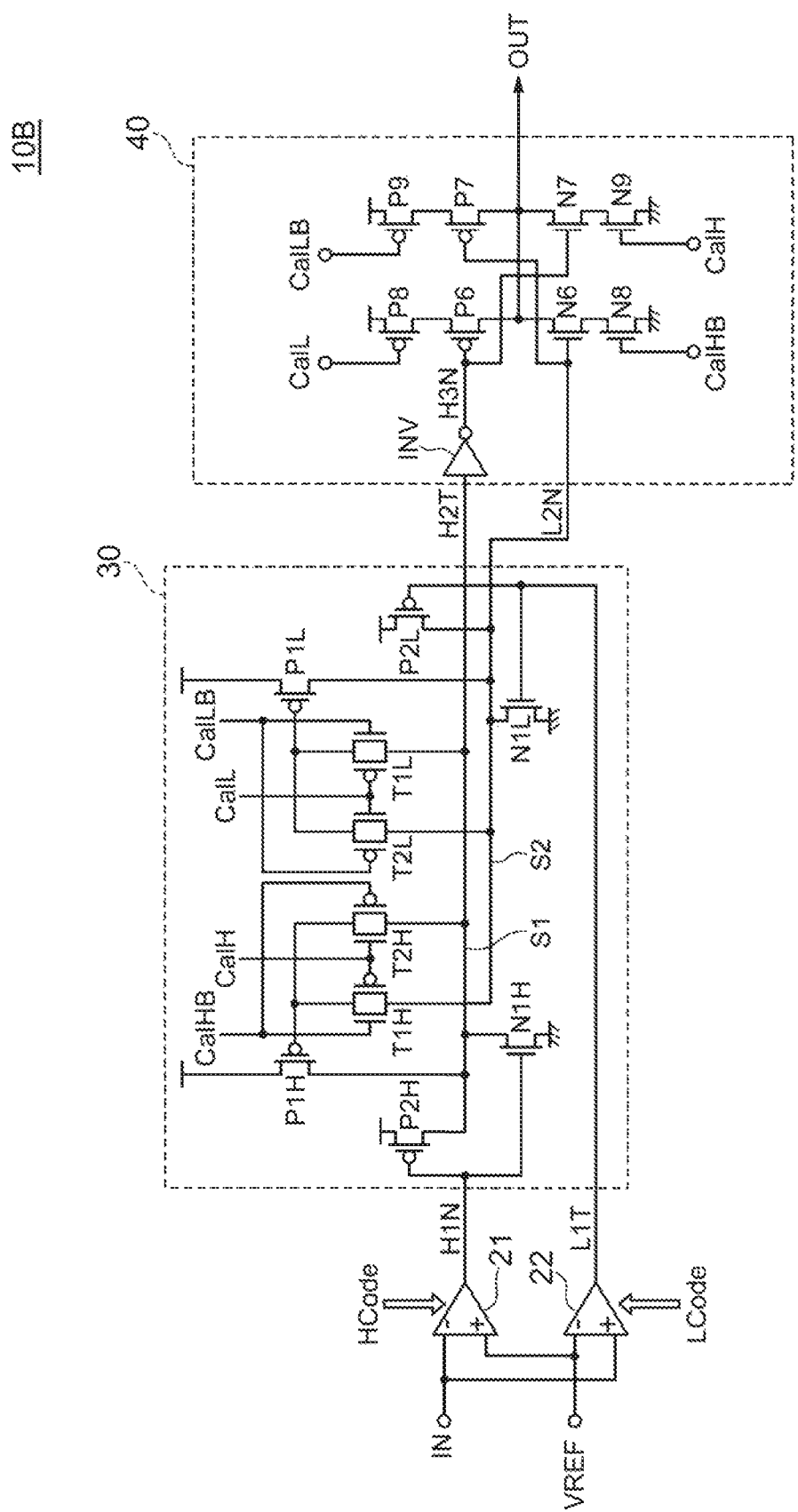
FIG. 5 is a circuit diagram of an input buffer circuit according to a second modification.

FIG. 5 is a circuit diagram of an input buffer circuit 10B according to a second modification. The input buffer circuit 10B shown in FIG. 5 is different from the input buffer circuit 10 shown in FIG. 2 in that the transistors P3H to P5H are replaced with transfer gates T1H and T2H and the transistors P3L to P5L are replaced with transfer gates T1L and T2L. The transfer gates T1H and T2H exclusively conduct electricity on the basis of the calibration signals CalH and CalHB. The transfer gates T1L and T2L exclusively conduct electricity on the basis of the calibration signals CalL and CalLB. The gate electrode of the transistor P1H is connected to the internal signal lines S2 and S1 via the transfer gates T1H and T2H, respectively. The gate electrode of the transistor P1L is connected to the internal signal lines S1 and S2 via the transfer gates T1L and T2L, respectively. Therefore, in a normal operation, the transistors P1H and P1L are cross-coupled to tire internal signal lines S1 and S2. Meanwhile, in a calibration operation, the gate of the transistor P1H can be connected to the internal signal line S1, and the gate of the transistor P1L can be connected to the internal signal line S2. Therefore, the input buffer circuit 10B can perform the same operation as the input buffer circuit 10 shown in FIG. 2.

Although this invention has been disclosed in the context of certain preferred embodiments and examples, it will be understood by those skilled in the art that the inventions extend beyond the specifically disclosed embodiments to other alternative embodiments and or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying modes of the disclosed invention. Thus, it is intended that the scope of at least some of the present invention herein disclosed should not be limited by the particular disclosed embodiments described above.

The invention claimed is:

1. An apparatus comprising:
   first and second signal lines;
   a first differential amplifier having an inverting input node receiving an input signal, a non-inverting input node receiving a reference potential, and an output node connected to the first signal line;
   a second differential amplifier having an inverting input node receiving the reference potential, a non-inverting input node receiving the input signal, and an output node connected to the second signal line;
   a level shift circuit cross-coupled to the first and second signal lines;
   a first replica circuit connected to the first signal line;
   a second replica circuit connected to the second signal line; and
   a first switch circuit configured to activate one of the level shift circuit, the first replica circuit, and the second replica circuit.

2. The apparatus of claim 1,
   wherein the first differential amplifier includes a first inverter circuit configured to drive the first signal line, and
   wherein the second differential amplifier includes a second inverter circuit configured to drive the second signal line.

3. The apparatus of claim 1,
   wherein the level shift circuit includes first and second transistors,
   wherein the first transistor has a control electrode connected to the second signal line, and
   wherein the second transistor has a control electrode connected to the first signal line.

4. The apparatus of claim 3,
   wherein the first replica circuit includes a first replica transistor, and
   wherein the first replica transistor has a control electrode connected to the first signal line.

5. The apparatus of claim 4,
   wherein the second replica circuit includes a second replica transistor, and
   wherein the second replica transistor has a control electrode connected to the second signal line.

6. The apparatus of claim 5, wherein the first switch circuit includes:
   a third transistor connected in series with the first transistor;
   a fourth transistor connected in series with the second transistor;
   a fifth transistor connected in series with the first replica transistor; and
   a sixth transistor connected in series with the second replica transistor.

7. The apparatus of claim 6, wherein one of the third and fifth transistors is exclusively brought into an on state.

8. The apparatus of claim 7, wherein one of the fourth and sixth transistors is exclusively brought into the on state.

9. The apparatus of claim 8, wherein the first, second, third, fourth, fifth, and sixth transistors and the first and second replica transistors are a first conductivity type.

10. The apparatus of claim 9, wherein each of the third, fourth, fifth, and sixth transistors has a source electrode supplied with a first power potential.

11. The apparatus of claim 10, wherein each of the fifth, and sixth transistors has a drain electrode supplied with a second power potential when the third and fourth transistors are brought into an on state.

12. The apparatus of claim 1, further comprising an output circuit configured to generate an output signal based on a potential difference between the first and second signal lines.

13. The apparatus of claim 12,
wherein the output circuit includes:
   a third inverter circuit having an input node connected to the first signal line;
   seventh and eighth transistors having a first conductivity type;
   ninth and tenth transistors having a second conductivity type; and
   an output terminal connected in common to each drain electrode of the seventh, eighth, ninth, and tenth transistors,
wherein each of the seventh and tenth transistors has a gate electrode connected to an output node of the third inverter circuit, and
wherein each of the eighth and ninth transistors has a gate electrode connected to the second signal line.

14. The apparatus of claim 13, wherein the output circuit further includes:
   a second switch circuit configured to activate one of the seventh and eighth transistors; and
   a third switch circuit configured to activate one of the ninth and tenth transistors.

15. The apparatus of claim 14,
wherein the second switch circuit includes:
   an eleventh transistor having the first conductivity type connected in series with the seventh transistor; and
   a twelfth transistor having the first conductivity type connected in series with the eighth transistor, and
wherein the third switch circuit includes:
   a thirteenth transistor having the second conductivity type connected in series with the ninth transistor; and
   a fourteenth transistor having the second conductivity type connected in series with the tenth transistor.

16. The apparatus of claim 15,
wherein one of the eleventh and twelfth transistors is exclusively brought into an on state, and
wherein one of the thirteenth and fourteenth transistors is exclusively brought into an on state.

17. The apparatus of claim 1,
wherein the first differential amplifier is configured to be able to adjust an input offset characteristic between the non-inverting input node and the inverting input node by a first code signal, and
wherein the second differential amplifier is configured to be able to adjust an input offset characteristic between the non-inverting input node and the inverting input node by a second code signal different from the first code signal.

18. An apparatus comprising:
first and second signal lines;
a first differential amplifier having an inverting input node receiving an input signal, a non-inverting input node receiving a reference potential, and an output node connected to the first signal line;
a second differential amplifier having an inverting input node receiving the reference potential, a non-inverting input node receiving the input signal, and an output node connected to the second signal line;
a first transistor connected to the first signal line;
a second transistor connected to the second signal line;
a first switch circuit configured to connect a control electrode of the first transistor to one of the first and second signal lines; and
a second switch circuit configured to connect a control electrode of the second transistor to one of the first and second signal lines.

19. An apparatus comprising:
a signal line;
a differential amplifier configured to control a potential of the signal line based on a potential difference between an input signal and a reference potential;
a level shift circuit configured to drive the signal line to a power potential supplied from a power line when the potential of the signal line indicates a first logic level, the level shift circuit including a first transistor coupled between the first power line and the signal line;
a second transistor coupled between the first power line and the signal line, the second transistor having a control electrode connected to the signal line; and
a switch circuit configured to exclusively supply the power potential to one of the first and second transistors.

20. The apparatus of claim 19, wherein the switch circuit includes a third transistor coupled between the first power line and the first transistor, and a fourth transistor coupled between the first power line and the second transistor.

* * * * *